(12) United States Patent
Trent et al.

(10) Patent No.: US 11,615,900 B2
(45) Date of Patent: Mar. 28, 2023

(54) METHOD OF VIRTUALLY ADHERING MATERIALS TO SURFACES PRIOR TO ENCAPSULATION

(71) Applicant: RAYTHEON COMPANY, Waltham, MA (US)

(72) Inventors: Catherine Trent, Allen, TX (US); Gary A. Frazier, Garland, TX (US); Kyle L. Grosse, Dallas, TX (US)

(73) Assignee: RAYTHEON COMPANY, Waltham, MA (US)

( * ) Notice: Subject to any disclaimer, the term of this patent is extended or adjusted under 35 U.S.C. 154(b) by 297 days.

(21) Appl. No.: 15/992,965

(22) Filed: May 30, 2018

(65) Prior Publication Data
US 2019/0371502 A1    Dec. 5, 2019

(51) Int. Cl.
| | |
|---|---|
| *H01F 1/00* | (2006.01) |
| *C23C 14/10* | (2006.01) |
| *C23C 14/22* | (2006.01) |
| *C23C 14/24* | (2006.01) |
| *C23C 14/34* | (2006.01) |
| *C25D 7/00* | (2006.01) |
| *H01F 41/18* | (2006.01) |
| *H01F 41/26* | (2006.01) |

(52) U.S. Cl.
CPC ........... *H01F 1/0045* (2013.01); *C23C 14/10* (2013.01); *C23C 14/223* (2013.01); *C23C 14/24* (2013.01); *C23C 14/34* (2013.01); *C25D 7/001* (2013.01); *C25D 7/006* (2013.01); *H01F 41/18* (2013.01); *H01F 41/26* (2013.01)

(58) Field of Classification Search
None
See application file for complete search history.

(56) References Cited

U.S. PATENT DOCUMENTS

| | | | |
|---|---|---|---|
| 5,547,748 A | 8/1996 | Ruoff et al. | |
| 6,387,485 B1 | 5/2002 | Bielek et al. | |
| 6,741,019 B1 * | 5/2004 | Filas | H01J 1/304 313/309 |
| 6,987,302 B1 * | 1/2006 | Chen | B82Y 10/00 257/368 |
| 7,335,408 B2 * | 2/2008 | Kyotani | B82Y 10/00 428/34.1 |
| 2009/0202644 A1 * | 8/2009 | Gogotsi | B82Y 30/00 424/489 |

(Continued)

FOREIGN PATENT DOCUMENTS

| | | | | |
|---|---|---|---|---|
| CN | 105565295 | * | 5/2016 | ........... C01P 2006/42 |

OTHER PUBLICATIONS

Muratore et al. "Nanoparticle decoration of carbon nanotubes by sputtering" Carbon 57, 2013, p. 274-281 (Year: 2013).*

(Continued)

*Primary Examiner* — Mandy C Louie
(74) *Attorney, Agent, or Firm* — Cantor Colburn LLP

(57) ABSTRACT

A virtual adhesion method is provided. The virtual adhesion method includes increasing a magnetic characteristic of an initial structure, supporting the initial structure on a surface of a substrate, generating a magnetic field directed such that the initial structure is forced toward the surface of the substrate and forming an encapsulation, which is bound to exposed portions of the surface, around the initial structure.

16 Claims, 3 Drawing Sheets

(56) References Cited

U.S. PATENT DOCUMENTS

2011/0204432 A1* 8/2011 Chen ................ G03F 7/165
257/325
2017/0203256 A1* 7/2017 Chen ................ B01D 67/0093

OTHER PUBLICATIONS

Baldrich et al., "Magnetic entrapment for fast, simple and reversible electrode modification with carbon nanotubes: Application to dopamine detection", Biosensors and Bioelectronics 26, 2011, pp. 1876-1882.

Correa-Duarte et al., "Alignment of Carbon Nanotubes under Low Magnetic Fields through Attachment of Magnetic Nanoparticles", The Journal of Physical Chemistry B, Letters, 2005, 109, pp. 1906-19063.

ISR/WO, dated Oct. 1, 2019, RAY0376PCT, PCT Application No. PCT/US2019/034237, total 18 pages.

Kim et al., "Anisotropic conductivity of magnetic carbon nanotubes embedded in epoxy matrices", Carbon, 49, 2011, pp. 54-61.

Ma et al., "The production of horizontally aligned single-walled carbon nanotubes", Carbon, 49, 2011, pp. 4098-4110.

* cited by examiner

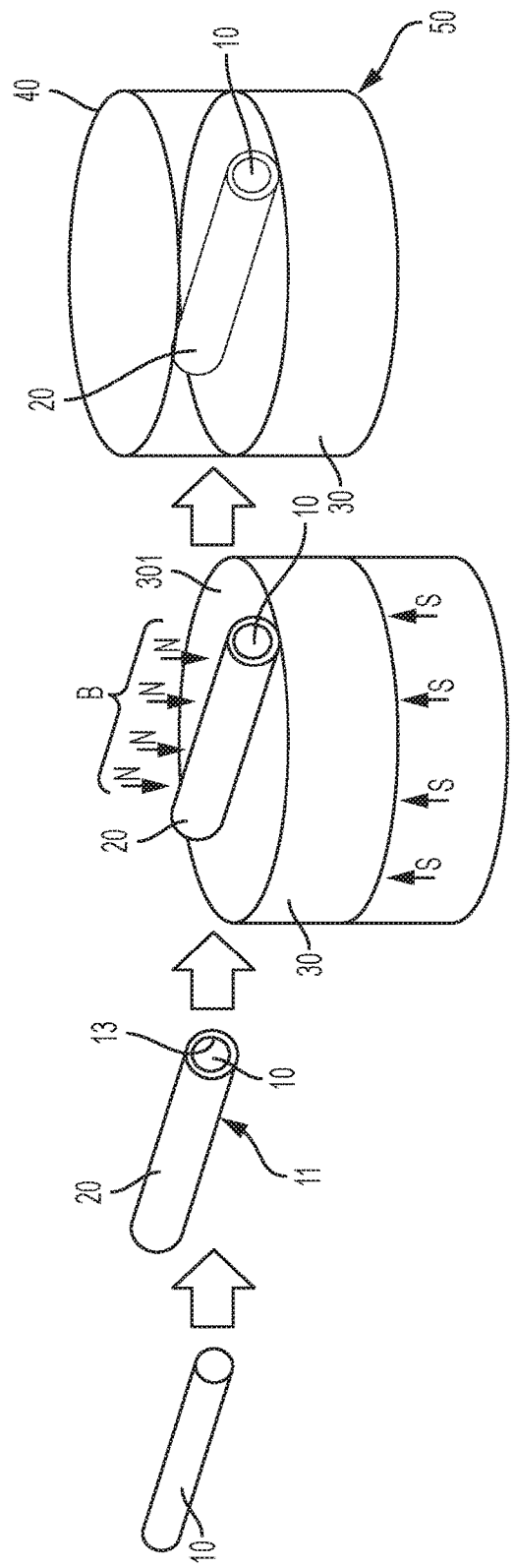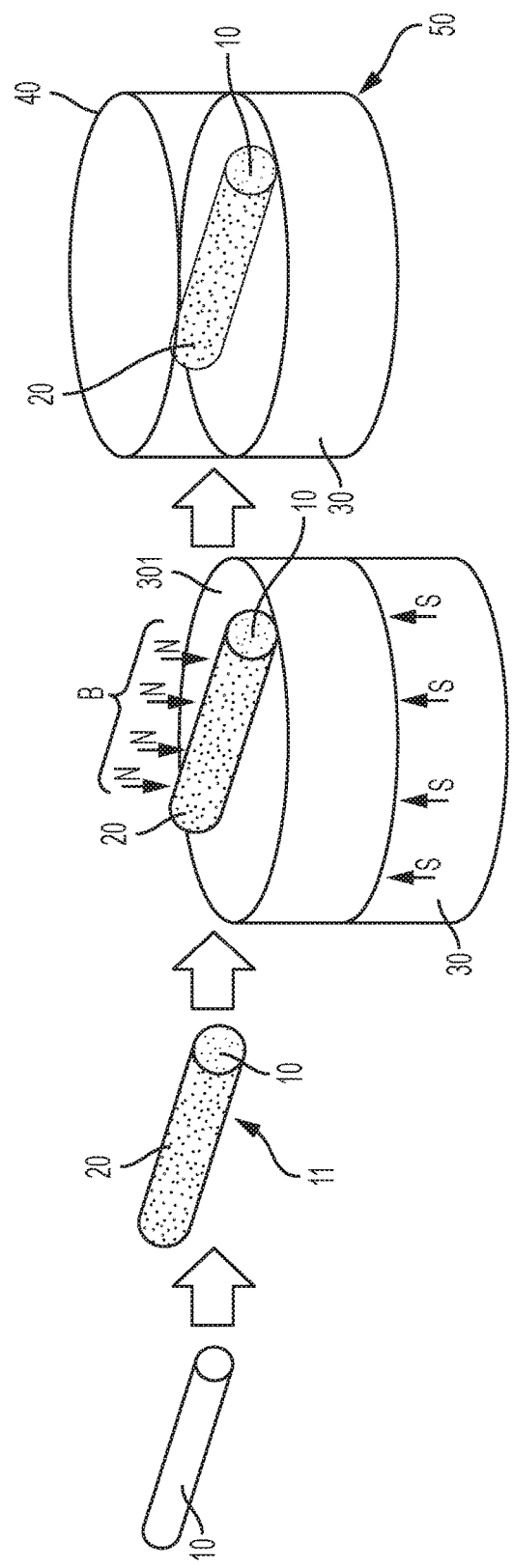

METHOD OF VIRTUALLY ADHERING MATERIALS TO SURFACES PRIOR TO ENCAPSULATION

BACKGROUND

The present disclosure relates to magnetic adhesion and, more particularly, to a method of providing virtual adhesion of materials to surfaces prior to encapsulation.

Carbon nanotubes (CNTs) are allotropes of carbon with a cylindrical nanostructure. They have unusual properties, such as exceptional strength and stiffness and are thus valuable in various fields including, but not limited to, nanotechnology, electronics, optics and other fields of materials science and technology.

Making use of CNTs in one or more technological fields often requires that they be secured to a substrate formed of inorganic materials. Current processes for securing or adhering CNTs to inorganic substrates are often problematic, however, since adhesion typically requires the use of epoxies, gels or chemical adhesives. In these cases, contaminates are introduced into the system which can inhibit or degrade the performance of further processing and ultimately weaken or rendered useless the resulting structure. Other adhesion techniques make use of Van der Waals forces or electrostatic attraction but are usually insufficiently strong to hold the CNTs in place.

SUMMARY

According to one embodiment, a virtual adhesion method is provided. The virtual adhesion method includes increasing a magnetic characteristic of an initial structure, supporting the initial structure on a surface of a substrate, generating a magnetic field directed such that the initial structure is forced toward the surface of the substrate and forming an encapsulation, which is bound to exposed portions of the surface, around the initial structure.

According to another embodiment, a virtual adhesion method is provided and includes coating an initial structure with magnetic particles to form a magnetic particle coating on the initial structure, supporting the initial structure with the magnetic particle coating on a surface of a substrate, generating a magnetic field directed such that the magnetic particles of the magnetic particle coating are forced toward the surface of the substrate and forming an encapsulation, which is bound to exposed portions of the surface, around the initial structure with the magnetic particle coating.

According to yet another embodiment, a non-metallic element encapsulation is provided and includes an inorganic and non-metallic substrate, a non-magnetic element, a magnetic particle coating disposed to coat the non-metallic element and an inorganic and non-metallic encapsulation disposed about and in direct contact with the magnetic particle coating to secure the non-magnetic element with the magnetic particle coating to a surface of the inorganic and non-metallic substrate.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts:

FIG. 2 is a graphical display of the virtual adhesion method of FIG. 1 in accordance with embodiments;

FIG. 3 is a graphical display of the virtual adhesion method of FIG. 1 in accordance with embodiments;

DETAILED DESCRIPTION

As will be described below, a virtual adhesion method is provided and allows for the transferring and temporary affixing of structures to a surface before the structures are encased by a protective layer. The virtual adhesion method avoids the use of glues or binders which can adversely impact surface properties to accomplish temporary adhesion of the structures to the surface.

Figure 1:
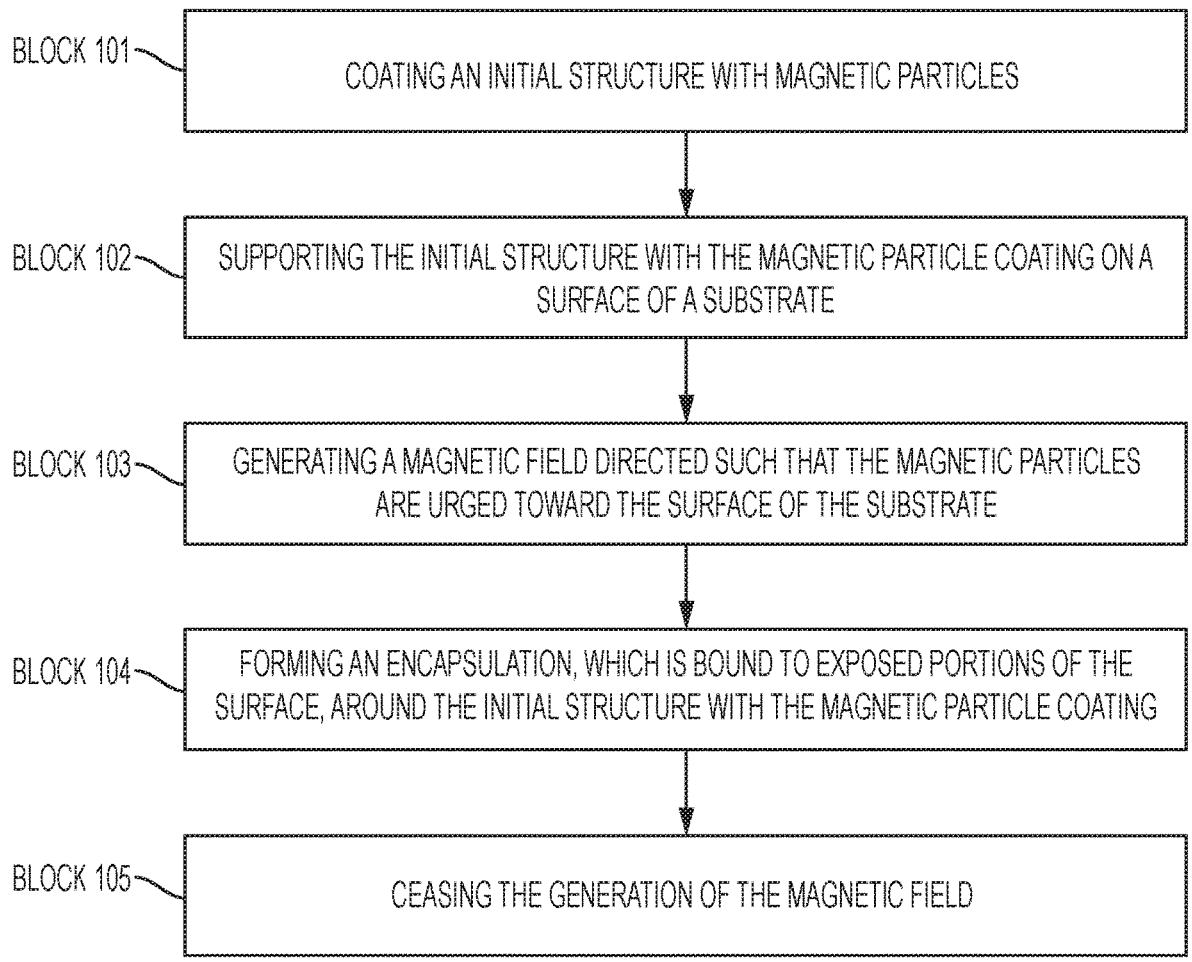
FIG. 1 is a flow diagram illustrating a virtual adhesion method in accordance with embodiments.

With reference to FIGS. 1-3, a virtual adhesion method is provided. As shown in FIGS. 1 and 2, the method includes coating or integrating an initial structure 10 with magnetic particles 11 to form a magnetic particle coating 20 on the initial structure 10 (block 101 of FIG. 1). The initial structure 10 may be provided as a CNT 12, for example, but it is to be understood that any small scale non-magnetic structure can be used as the initial structure 10. Nevertheless, for purposes of clarity and brevity, the following description will relate to the case in which the initial structure 10 is provided as the CNT 12.

As shown in FIG. 2, the coating may be accomplished by sputtering or electroplating of ferromagnetic material onto an exterior surface 13 of the initial structure 10. Alternately, as shown in FIG. 3, the coating or integrating may be accomplished by an integration of magnetic particles into the initial structure 10 within a liquid suspension. However, the initial structure 10 is coated or integrated with magnetic particles, it is to be understood that a result of the coating or integration process is that a magnetic characteristic (i.e., the magnetic forces applied to the initial structure 10 with the magnetic particle coating 20 in a magnetic field) of at least the exterior surface 13 of the initial structure 10 is increased.

While the magnetic particles can be coated onto or integrated into the initial structure 10, the following description will generally relate to the case of the magnetic particles being coated onto the exterior surface 13 of the initial structure 10. This is being done for clarity and brevity and is not intended to otherwise limit the scope of the claims or the application as a whole.

The method further includes supporting the initial structure 10 with the magnetic particle coating 20 on a surface 301 of a substrate 30 (block 102 of FIG. 1) and generating a magnetic field B which is directed such that the magnetic particles of the magnetic particle coating 20 are forced by means of magnetic attraction toward the surface 301 of the substrate 30 (block 103 of FIG. 1). The substrate 30 may be formed of quartz or other similar inorganic and non-metallic materials. The surface 301 can be substantially flat or otherwise unsuited for securely retaining the initial structure 10 with the magnetic particle coating 20 thereon without the aid of the magnetic field B. However, with the magnetic field B being generated and with the magnetic particles of the magnetic particle coating 20 being forced toward the surface 301, the initial structure 10 with the magnetic particle coating 20 is securely retained on the surface 301, and that the structure 10 follows the contour of the surface onto which it is retained.

In accordance with embodiments, the generating of the magnetic field B may be achieved by disposing the substrate 30 on a permanent-magnet or on an electro-magnet to which a current is applied.

In either case, the generating of the magnetic field B may include generating the magnetic field B to have a magnitude which is sufficient to constrain the initial structure 10 with the magnetic particle coating 20 on the surface 301 and generating the magnetic field B to have a magnitude which is insufficient to dislodge the magnetic particle coating 20 from the initial structure 10.

With the initial structure 10 with the magnetic particle coating 20 securely retained on the surface 301 of the substrate 30, the method also includes forming an encapsulation 40, which is bound to exposed portions of the surface 301, around the initial structure 10 with the magnetic particle coating 20 (block 104 of FIG. 1). The encapsulation 40 may be formed of similar materials as the substrate 30 such that, in an event the substrate 30 is formed of quartz, the encapsulation 40 is similarly formed of quartz.

The encapsulation 40 may be formed as a result of at least one of sputtering processes, evaporation processes, liquid drying processes and/or other suitable processes and may, but does not need to, exhibit a seam feature running along the original surface 301.

Since the encapsulation 40 is formed about the initial structure 10 with the magnetic particle coating 20, the resulting structure 50 includes the initial structure 10 provided as a non-magnetic element, the magnetic particle coating 20 disposed to coat the non-metallic element and an inorganic and non-metallic encapsulation 40 disposed about and in direct contact with the magnetic particle coating 20. Thus, the resulting structure 50 is characterized in that the interior surface of the encapsulation 40 directly contacts the exterior surface of the magnetic particle coating 20, in that the magnetic particle coating 20 can have but does not need to have any further structural or functional purpose and in that the resulting structure 50 has an absence of adhesives, glues, resins or epoxies between interior surface of the encapsulation 40 and the exterior surface of the magnetic particle coating 20 and the surface 301.

Figure 4:
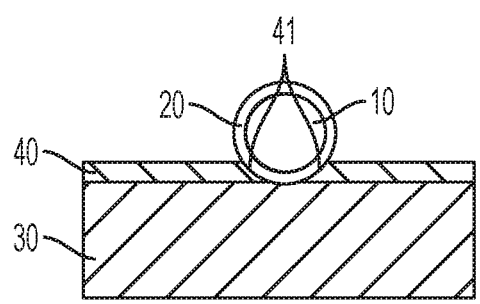
FIG. 4 is an axial view of an initial structure surrounded by a partial encapsulation in accordance with embodiments.

With continued reference to FIGS. 1-3 and with additional reference to FIG. 4, once the encapsulation 40 is at least partially or fully formed, the generating of the magnetic field B can be disengaged or ceased (block 105 of FIG. 1) and further processing can be conducted. As shown in FIG. 4, the ceasing of the generating of the magnetic field B can occur once the encapsulation 40 is partially completed to an extent that the initial structure 10 with the magnetic particle coating 20 is securely retained in place by the completed portion of the encapsulation 40. That is, the ceasing of the generating of the magnetic field B can occur once walls 41 of the encapsulation 40 on either side of the initial structure 10 with the magnetic particle coating 20 are tall enough to tightly form a groove about and along the initial structure 10 with the magnetic particle coating 20.

Figure 5A:
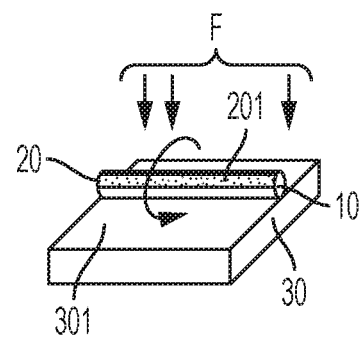
FIG. 5A is an illustration of an initial structure with a coating strip at an initial moment prior to magnetization in accordance with embodiments.
Figure 5B:
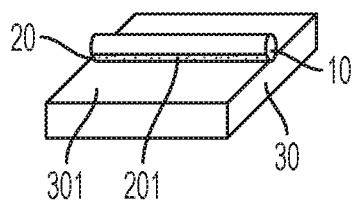
FIG. 5B is an illustration of an initial structure with a coating strip at a moment following magnetization in accordance with embodiments.
Figure 6:
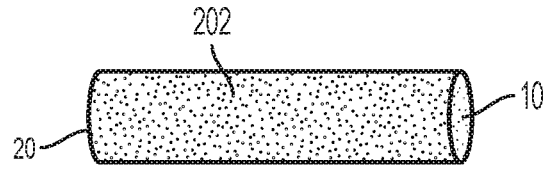
FIG. 6 is a perspective view of an initial structure with a patterned magnetic particle coating in accordance with embodiments.

In accordance with further embodiments and with reference to FIGS. 5A and 5B and to FIG. 6, the coating of the initial structure 10 may include patterning the magnetic particle coating 20. Such patterning may be directed for promoting certain magnetic properties while limiting other issues arising from the presence of the coating 20 and/or for promoting certain EM performance characteristics (e.g., promoting transmission and reception of electro-magnetic signals) for the resulting structure 50. For example, as shown in FIGS. 5A and 5B, the coating of the initial structure 10 may be conducted so as to limit the coating 20 to a coating strip 201 running along a side of the initial structure 10. Here, in an event the initial structure 10 is placed on the surface 301 of the substrate 30 with the coating strip 201 offset from the surface 301 (see FIG. 5A), the initial structure 10 will roll toward a position at which the coating strip 201 contacts the surface 301 (see FIG. 5B) once the magnetic field B is generated due to the interaction of the magnetic field B with the magnetic particles of the coating strip 201. As another example, as shown in FIG. 6, the magnetic particle coating 20 may be patterned to exhibit a self-repeating coating pattern 202 or to provide for transmission zones so as to provide for certain EM transmission capabilities or properties for the resulting structure 50. Selective magnetics to float the majority of 10 above the substrate to facilitate encapsulation.

Figure 7:
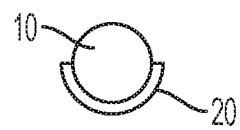
FIG. 7 is an axial view of an initial structure half-coated with a magnetic particle coating in accordance with embodiments.

With reference to FIG. 7, in yet another example, only one side of the initial structure 10 may be coated with the magnetic material of the coating 20 by, e.g., vacuum evaporation and sputtering deposition.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A virtual adhesion method, comprising:
   increasing a magnetic characteristic of an exterior outer surface of an initial structure by coating the exterior outer surface of the initial structure with magnetic particles by at least one of sputtering and electroplating;
   supporting the initial structure lengthwise on a surface of a substrate;

generating a magnetic field directed such that an entire length of the initial structure is forced by magnetic attraction toward the surface of the substrate; and forming an encapsulation, which is bound to exposed portions of the surface, around the initial structure and along the entire length thereof, wherein the generating of the magnetic field comprises generating the magnetic field to have a magnitude insufficient to dislodge the magnetic particles coating the exterior outer surface of the initial structure from the initial structure.

2. The virtual adhesion method according to claim 1, wherein the generating of the magnetic field comprises disposing the substrate on an electro-magnet configured to magnetically attract the initial structure and applying current to the electro-magnet.

3. The virtual adhesion method according to claim 1, further comprising disengaging the magnetic field following partial completion of the forming of the encapsulation once walls of the encapsulation on either side of the initial structure are sufficiently tall to form a groove with opposite curved walls respectively abutting opposite curved sides of the initial structure that extends about and along the entire length of the initial structure.

4. The virtual adhesion method according to claim 1, wherein the forming of the encapsulation comprises forming the encapsulation along the entire length of the initial structure with sufficient size to form a groove with opposite curved walls respectively abutting opposite curved sides of the initial structure that extends about and along the entire length of the initial structure to secure the initial structure to the surface.

5. The virtual adhesion method according to claim 1, wherein the forming of the encapsulation comprises at least one of sputtering, evaporation and liquid drying.

6. The virtual adhesion method according to claim 1, wherein the initial structure comprises a carbon nanotube, the substrate comprises an inorganic, non-metallic material and the encapsulation comprise quartz.

7. A virtual adhesion method, comprising:
coating an exterior outer surface of an initial structure with magnetic particles by at least one of sputtering and electroplating to form a magnetic particle coating on an entire length of the exterior outer surface of the initial structure;

supporting the initial structure with the magnetic particle coating lengthwise on a surface of a substrate;

generating a magnetic field directed such that the magnetic particles of the magnetic particle coating on the entire length of the exterior outer surface of the initial structure are forced by magnetic attraction toward the surface of the substrate; and forming an encapsulation, which is bound to exposed portions of the surface, around and along the entire length of the exterior outer coating of the initial structure with the magnetic particle coating, wherein the generating of the magnetic field comprises:
generating the magnetic field to have a magnitude sufficient to magnetically constrain the initial structure with the magnetic particle coating on the surface; and generating the magnetic field to have a magnitude insufficient to decrease the magnetic characteristic of the initial structure by dislodging the magnetic particles coating the exterior outer surface of the initial structure from the initial structure.

8. The virtual adhesion method according to claim 7, wherein the generating of the magnetic field comprises disposing the substrate on an electro-magnet configured to magnetically attract the initial structure and applying current to the electro-magnet.

9. The virtual adhesion method according to claim 7, further comprising disengaging the magnetic field following partial completion of the forming of the encapsulation once walls of the encapsulation on either side of the initial structure are sufficiently tall to form a groove with opposite curved walls respectively abutting opposite curved sides of the initial structure that extends about and along the entire length of the initial structure.

10. The virtual adhesion method according to claim 7, wherein the forming of the encapsulation comprises forming the encapsulation along the entire length of the initial structure with sufficient size to form a groove with opposite curved walls respectively abutting opposite curved sides of the initial structure that extends about and along the entire length of the initial structure to secure the initial structure to the surface.

11. The virtual adhesion method according to claim 7, wherein the forming of the encapsulation comprises at least one of sputtering, evaporation and liquid drying.

12. The virtual adhesion method according to claim 7, wherein the initial structure comprises a carbon nanotube, the substrate comprises an inorganic, non-metallic material and the encapsulation comprise quartz.

13. The virtual adhesion method according to claim 7, wherein:
the coating of the exterior outer surface of the initial structure comprises patterning the magnetic particle coating, and the patterning of the magnetic particle coating comprises forming the magnetic particle coating into a coating strip on the exterior outer surface of the initial structure to promote a forcing of the initial structure by the magnetic attraction to rotate whereby the magnetic particle coating formed into the coating strip is rolled due to the magnetic attraction toward the surface of the substrate.

14. The virtual adhesion method according to claim 7, wherein:
the coating of the exterior outer surface of the initial structure comprises patterning the magnetic particle coating, and the patterning of the magnetic particle coating comprises forming the magnetic particle coating to exhibit a self-repeating coating pattern to promote transmission and reception of electro-magnetic signals.

15. A virtual adhesion method, comprising:
coating an exterior outer surface of a carbon nanotube with magnetic particles by at least one of sputtering and electroplating to form a magnetic particle coating on an entire length of the exterior outer surface;

supporting the carbon nanotube with the magnetic particle coating lengthwise on a surface of a substrate;

generating a magnetic field directed such that the magnetic particles of the magnetic particle coating on the entire length of the exterior outer surface of the initial structure are forced by magnetic attraction toward the surface of the substrate; and forming an encapsulation, which is bound to exposed portions of the surface, around and along the entire length of the exterior outer coating of the carbon nanotube with the magnetic particle coating, wherein the generating of the magnetic field comprises:
generating the magnetic field to have a magnitude sufficient to magnetically constrain the initial structure with the magnetic particle coating on the surface; and
generating the magnetic field to have a magnitude insufficient to decrease the magnetic characteristic of the initial structure by dislodging the magnetic particles coating the exterior outer surface of the initial structure from the initial structure.

16. The virtual adhesion method according to claim 15, wherein the coating of the exterior outer surface of the carbon nanotube comprises patterning the magnetic particle coating into at least one of a coating strip and a self-repeating coating pattern.

\* \* \* \* \*